United States Patent
Horikawa et al.

(10) Patent No.: US 6,383,408 B1
(45) Date of Patent: May 7, 2002

(54) PIEZOELECTRIC CERAMIC AND SURFACE WAVE DEVICE USING THE SAME

(75) Inventors: Katsuhiro Horikawa, Shiga-ken; Koji Matsubara, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/676,995

(22) Filed: Sep. 29, 2000

(30) Foreign Application Priority Data

Sep. 29, 1999 (JP) .............................. 11-275627

(51) Int. Cl.⁷ .............................. H01B 3/12; H01L 41/00
(52) U.S. Cl. .............................. 252/62.9 PZ; 501/134; 501/135
(58) Field of Search .................... 252/62.9 PZ; 501/134, 501/135

(56) References Cited

U.S. PATENT DOCUMENTS 3,956,150 A * 5/1976 Ouchi et al. .......... 252/62.9 PZ
6,299,791 B1 * 10/2001 Yoshizawa et al. ... 252/62.9 PZ

* cited by examiner

Primary Examiner—C. Melissa Koslow
(74) Attorney, Agent, or Firm—Ostrolenk, Faber, Gerb & Soffen, LLP

(57) ABSTRACT

A piezoelectric ceramic is provided which has a very low loss and superior workability in micro-fabrication. The piezoelectric ceramic contains at least Pb, Mn, Nb, Ti and Zr as primary metal components, in which, when the composition of the piezoelectric ceramic is represented by the formula $Pb_x\{(Mn_aNb_b)_yTi_zZr_{(1-Y-z)}\}O_3$, the x, y, z, a, and b are, on a molar basis, such that $0.95 \leq x \leq 0.995$, $0.055 \leq y \leq 0.10$, $0.40 \leq z \leq 0.55$, $2.01 \leq b/a \leq 2.40$, and $a+b=1$. In addition, the average grain diameter of the sintered piezoelectric ceramic is about 2 μm or less.

19 Claims, 3 Drawing Sheets

SAMPLE #22

SAMPLE #19

SAMPLE #28

PIEZOELECTRIC CERAMIC AND SURFACE WAVE DEVICE USING THE SAME

BACKGROUND OF THE INVENTION

1. Field of the Invention

The present invention relates to piezoelectric ceramics and to surface wave devices using the same, and more particularly, relates to a low loss piezoelectric ceramic for use in high frequency filters and in oscillators, specifically, for use in surface wave devices, and to a surface wave device using the same.

2. Description of the Related Art

Filters and oscillators using piezoelectric ceramics have been used for various kinds of electric/electronic products, such as communication apparatuses and audio-visual apparatuses. Recently, filters and oscillators using piezoelectric ceramics are being used at higher frequency ranges, for example, filters and oscillators, which use bulk waves, are applicable in practice to ranges of approximately few tens of MHZ by utilizing a shear vibration or a third harmonic thickness vibration. In a range of approximately 60 MHZ or more in which filters and oscillators using bulk waves are difficult to produce, filters and oscillators using surface waves have been used.

The surface wave devices using surface waves, for example, filters and oscillators, are devices exciting and propagating surface waves by supplying electric signals to electrodes thereof, in which at least one pair of electrodes each having at least one finger and being arranged so as to interdigitate with each other is disposed on a substrate having piezoelectric characteristics. As surface waves used for the surface wave devices, Rayleigh waves are most commonly used, and an SH wave (a horizontally-polarized shear wave), such as a BGS wave (the Bleustein-Gulyaev-Shimizu wave) and a Love wave, is also used which is a shear wave whose displacement is perpendicular to the propagating direction and the component is parallel to the surface of the substrate. The resonant frequencies and electrical and mechanical characteristics of the surface wave devices greatly depend on the characteristics of materials used for the piezoelectric substrates, as is the case with other piezoelectric devices, and are almost determined by the structures of comb electrodes each having at least one finger and being arranged so as to interdigitate with each other (IDT; Interdigital Transducer). Accordingly, improvement of the characteristics of the piezoelectric substrate is an effective technique for improving characteristics of the surface wave device.

As examples of surface wave devices using piezoelectric ceramics, proposals are disclosed in, for example, Japanese Unexamined Patent Application Publications No. 5-145, 368, No. 5-145,369, No. 5-145,370 and No. 5-183,376, in which critical characteristics of materials for use in the surface wave devices are described. In addition, various proposals for improving characteristics of the surface wave devices in view of the compositions of piezoelectric ceramics were subsequently disclosed in, for example, Japanese Unexamined Patent Application Publications No. 5-275, 967, No. 5-327,397, No. 8-310,862 and No. 9-93,078.

In the surface wave devices using the piezoelectric ceramics as piezoelectric substrates, there is a problem in that the loss at the high frequency ranges is large. Accordingly, single crystal materials, such as $LiNbO_3$, $LiTaO_3$ and quartz are primarily used for surface wave devices intended for use at high frequency ranges of not less than approximately 80 MHZ. The losses of the piezoelectric ceramics are larger than those of the single crystal materials, and the reason for this is believed to be that the mechanical quality factor $Q_m$ is small, the surface condition is degraded during microfabrication (poor workability in micro-fabrication), pores are generated, and so on. In addition, some of the surface wave devices using SH waves exploit the reflection at the edge surface thereof, and in these devices, the condition of the edge surface reflecting the surface waves influences the loss thereof. Accordingly, one of the reasons the device using the piezoelectric ceramic has a larger loss is believed to be poor workability in micro-fabrication of the edge surface reflecting the surface wave.

As methods for solving the problems of the surface wave devices using the piezoelectric ceramics, the critical characteristics of materials for use in the surface wave devices are disclosed in, for example, Japanese Unexamined Patent Application Publications No. 5-145,368, No. 5-145,369, No. 5-145,370 and No. 5-183,376 as described above. In addition, in Japanese Unexamined Patent Application Publications No. 5-275,967, No. 5-327,397, No. 8-310,862, No. 9-93,078, and so on, improvements in the loss and the heat stability of the piezoelectric ceramics are disclosed. However, when a surface wave device to be used in a range of 80 MHZ or more is formed according to Japanese Unexamined Patent Application Publications No. 5-145, 368, No. 5-145,369, No. 5-145,370, No. 5-183,376, No. 5-275,967 and No. 5-327,397, the ratio of the anti-resonant impedance Za to the resonant impedance Zr (i.e., Za/Zr) of the surface wave device is rapidly decreased at approximately 80 MHZ, whereby the device thus formed is difficult to use in practice. In a filter to be used in a narrower band range according to Japanese Unexamined Patent Application Publications No. 8-310,862 and No. 9-93,078, the electromechanical coefficient $k_{BGS}$ is too large and the Za/Zr value is insufficient at 80 MHZ and more, and hence, there is a problem in practical use. The reasons for the decrease in the Za/Zr of the piezoelectric ceramic are believed to be that, in particular, the density of the sintered piezoelectric ceramic is low due to the existence of pores, the stability at high frequency ranges and the workability in micro-fabrication are inferior, and so on.

SUMMARY OF THE INVENTION

Accordingly, it is an object of the present invention to provide a piezoelectric ceramic which has significantly low loss and superior workability in micro-fabrication, and to provide a surface wave device using the same.

A piezoelectric ceramic according to the present invention comprises at least lead (Pb), manganese (Mn), niobium (Nb), titanium (Ti) and zirconium (Zr) as primary metal components, wherein, when the composition of the primary components is represented by the formula $Pb_x\{(Mn_aNb_b)_yTi_zZr_{(1-y-z)}\}O_3$, the x, y, z, a, and b are, on a molar basis, such that $0.95 \leq x \leq 0.995$, $0.055 \leq y \leq 0.10$, $0.40 \leq z \leq 0.55$, $2.01 \leq b/a \leq 2.40$ and a+b=1, and the average grain diameter of the sintered piezoelectric ceramic is about 2 μm or less.

The piezoelectric ceramic according to the present invention preferably comprises not more than about 0.05 wt % $SiO_2$ contained in the major components.

In the piezoelectric ceramic according to the present invention, the z is preferably about 0.47 to 0.55, and the crystal system of the composition is preferably a tetragonal system.

In addition, in the piezoelectric ceramic according to the present invention, not more than about 5 mol % lead may be substituted with one of strontium (Sr), barium (Ca) and calcium (Ca).

Furthermore, a surface wave device of the present invention is formed of the piezoelectric ceramic according to the present invention.

A Pb {$(Mn_{1/3}Nb_{2/3})TiZr$}$O_3$-based material is one of the materials having the lowest loss among PZT-based piezoelectric ceramics, as disclosed in "Piezoelectric Ceramic Materials" P128, 1973, published by Gakken-sha. In order to significantly decrease the average grain diameter of the sintered material described above, in the present invention, it was discovered that a dense piezoelectric ceramic could be obtained which had significantly finer grains and lower loss at high frequency ranges, by a composition containing Nb above the known ratio of Nb to Mn in the conventional composition. In addition, when the amount of Pb is decreased below the stoichiometric content thereof, no foreign phase, such as a pyrochlore phase ($Pb_2Nb_2O_7$), exists in the sintered material, and hence, a piezoelectric ceramic having an even lower loss can be obtained. When the crystal system of the piezoelectric ceramic is the tetragonal system, the coercive electric field is further improved and the stability of polarization is increased, and hence, an even lower loss at high frequency ranges can be achieved. In addition, when the content of $SiO_2$ in the primary components is about 0.05 wt % or less, the fracture mode of the piezoelectric ceramic is intergranular fracture mode or intergranular-transgranular fracture mode, and hence, serious damage to the piezoelectric ceramic during fabrication can be avoided.

Furthermore, when the piezoelectric ceramic of the present invention is used for a surface wave device, workability in micro-fabrication is superior due to the fine grains thereof, and in particular, when the average grain diameter of the sintered material is about 2 μm or less, the loss at high frequency ranges can be significantly reduced.

The objects described above, other objects, features, and advantages of the present invention will be more apparent from the following detailed description of preferred embodiments thereof with reference to the accompanying drawings.

BRIEF DESCRIPTION OF THE DRAWINGS

FIG. 4A is a view showing the surface condition of sample #22, FIG. 4B is a view showing the surface condition of sample #19, and FIG. 4C is an enlarged view of the surface condition of sample #28.

DESCRIPTION OF THE PREFERRED EMBODIMENTS

Examples

Figure 1:
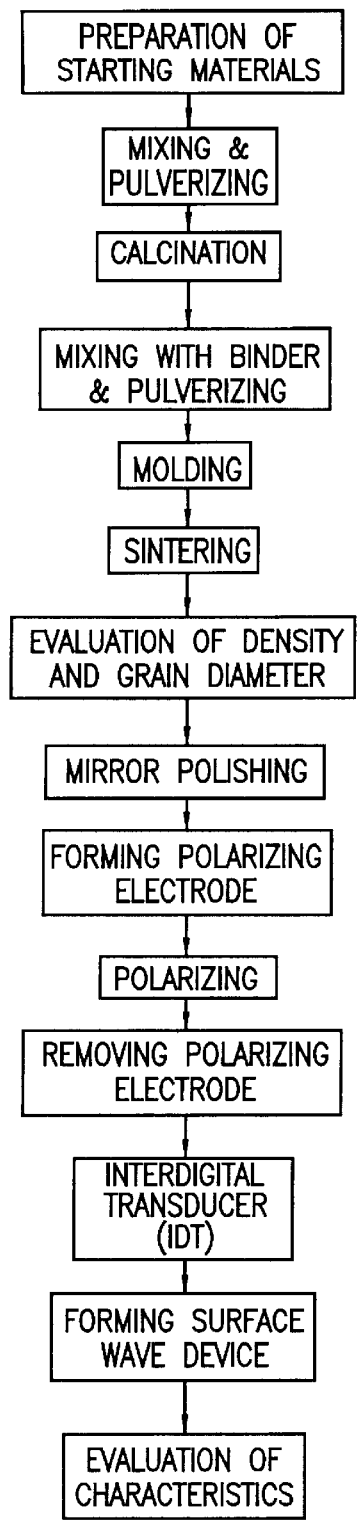
FIG. 1 is a chart showing manufacturing steps for a sample according to an example of the present invention and evaluation steps therefor.

FIG. 1 is a chart showing manufacturing steps for samples according to the examples of the present invention and evaluation steps therefor. Hereinafter, the details thereof will be described.

As starting materials, $Pb_3O_4$, $ZrO_2$, $TiO_2$, $MnCO_3$, $Nb_2O_5$ and $SiO_2$ were mixed and pulverized for 4 to 32 hours by using a ball mill so as to produce the compositions shown in Table 1. The mixtures were dehydrated and dried, and were then calcined at 850 to 1,000° C. for 2 hours. A binder, a dispersing agent and an anti-foaming agent, in a total amount of 3 to 10 wt %, were added to each powder thus obtained, and they were then mixed and pulverized for 8 to 16 hours by using a ball mill, thereby yielding a slurry. The slurry was molded by casting, resulting in a molded part of approximately 60 mm by 60 mm having a thickness of 0.8 to 1.5 mm. The molded body was sintered at 1,100 to 1,250° C. for 1 to 3 hours, and as a result, a sintered body was obtained. The density and the grain diameter of the sintered body were measured by an Archimedean method and an intercept method, respectively. Subsequently, the sintered body was polished by using polishing powders of #800 to #8,000 so as to produce a mirror surface thereof, resulting in a substrate for a piezoelectric device having a thickness of approximately 0.6 to 0.8 mm.

Table 1 shows x, y, z, a, and b in the general formula $Pb_x${$(Mn_aNb_b)_yTi_zZr_{(1-y-z)}$}$O_3$ representing the compositions of piezoelectric ceramics used in the example of the present invention, in which a+b=1, the amount of $SiO_2$, and the crystal systems of the samples.

Electrodes for polarization formed by deposition of Cu/Ag in the form of stripes were formed on two major surfaces of the piezoelectric ceramic substrate, and polarization was performed so that the direction thereof was parallel to the surface of the substrate. The polarization condition was such that an electric field of 2.0 to 3.0 kV/mm was applied for 30 to 60 minutes in oil at 60 to 120° C. Subsequently, the Cu/Ag electrode formed by deposition was removed by using an etching solution, thereby yielding a polarized piezoelectric ceramic substrate.

Figure 2:
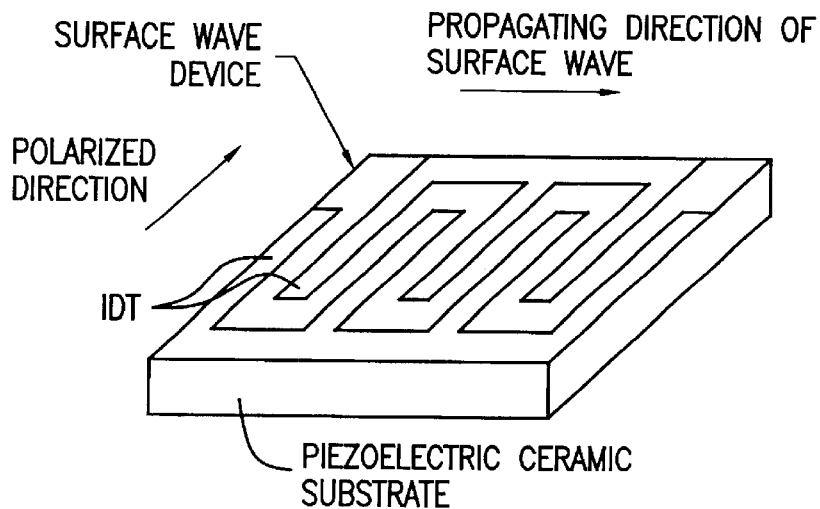
FIG. 2 is a perspective view of a surface wave device according to an example of the present invention.

For the formation of comb electrodes each having at least one finger and being arranged so as to interdigitate with each other (IDT), an Al film for the electrodes was formed on one of the major surfaces of the piezoelectric ceramic substrate by sputtering and was then patterned by photolithography. The piezoelectric ceramic substrate provided with the patterned Al electrodes was cut into a desired size, thereby yielding a surface wave device as shown in FIG. 2.

Figure 3:
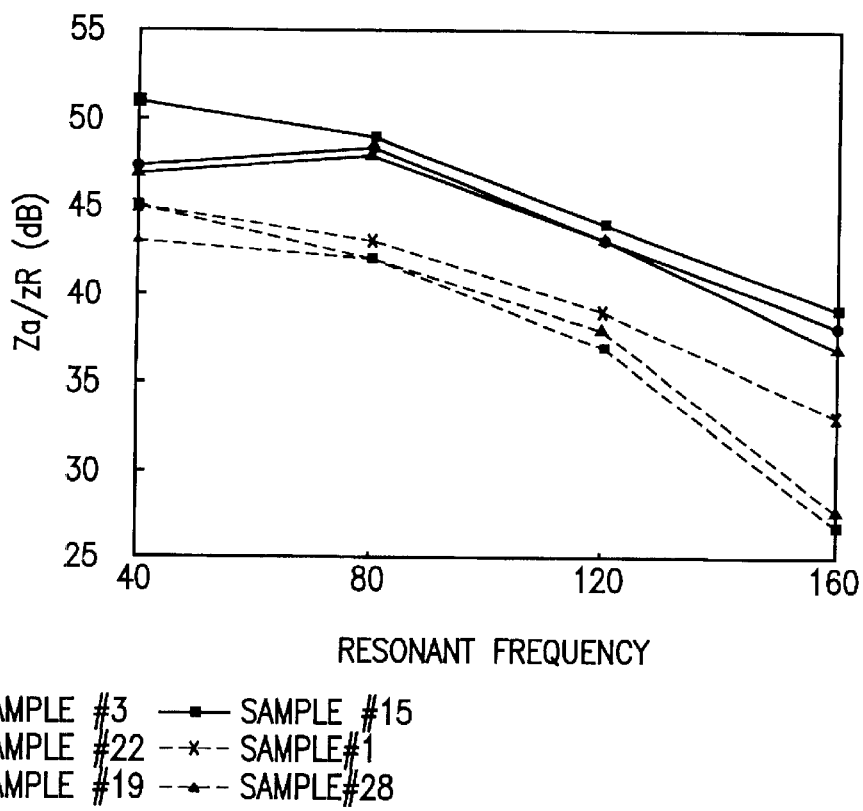
FIG. 3 is a graph showing the relationship between the Za/Zr and the resonant frequency of a typical surface wave device according to an example of the present invention.
Figure 4A:
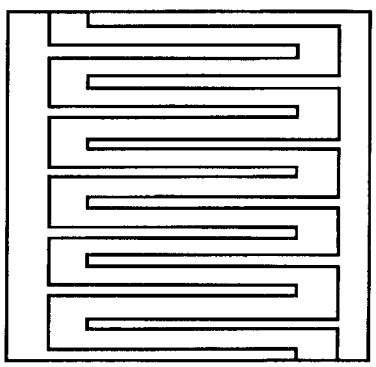
FIGS. 4A to C are views showing surface conditions of typical surface wave devices according to an example of the present invention.
Figure 4B:
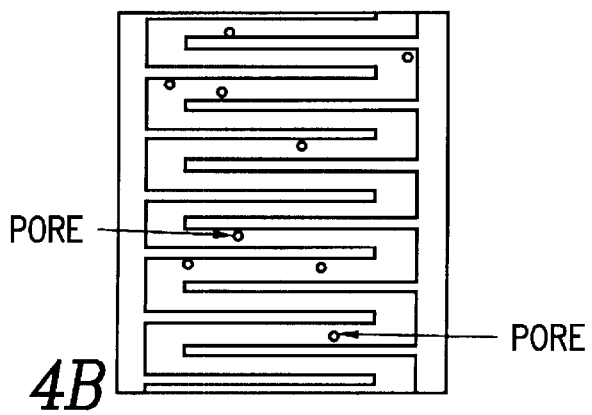
Figure 4C:
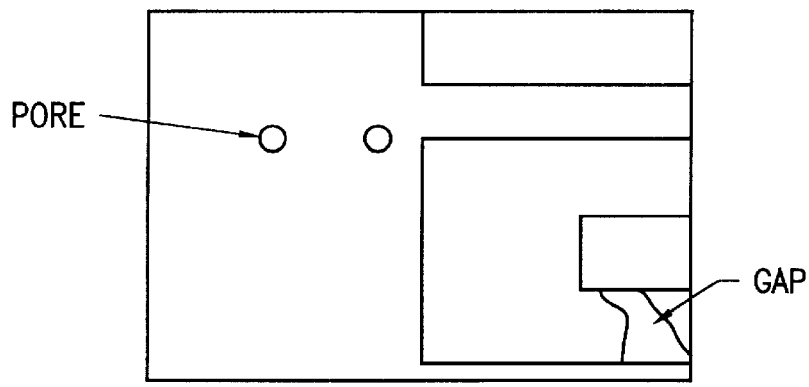

The surface wave device was fixed at a unit having a lead terminal and was connected with the lead terminal by wiring, whereby a surface wave device using a BGS wave (an SH wave) was obtained. In accordance with the procedure described above, surface wave devices having resonant frequencies of approximately 40 MHZ, 80 MHZ and 120 MHZ (partly including 160 MHZ) were formed of the individual materials shown in Table 1, and the characteristics of the surface wave devices were evaluated by a network analyzer. The evaluation items were the electromechanical coefficient $k_{BGS}$ of the BGS wave and the ratio of Za to Zr (Za/Zr) in which the Za was an anti-resonant impedance and the Zr was a resonant impedance. The results are shown in Table 2 together with the results of the densities and the grain diameters of the materials. In addition, the relationship between the resonant frequency and the Za/Zr of the typical example is shown in FIG. 3, and the surface conditions of the surface wave devices are shown in FIGS. 4A to 4C.

Table 2 is a table showing the sintered densities and the average grain diameters of the piezoelectric ceramics shown in Table 1 and the characteristics of the surface wave devices formed of the piezoelectric ceramics described above.

When a surface wave filter or an oscillator is actually formed, designing therefor is optimized by the shape of the surface wave device, the structure of comb electrodes (IDT), and combinations thereof based on the characteristics obtained from a simple prototype surface wave device, such as the surface wave device according to this example. In the case in which a filter is designed based on the characteristics of the surface wave device of this example, when the Za/Zr is 40 dB or more, the filter can be used in practice, and superior filter characteristics can be obtained when the Za/Zr is 45 dB or more. In addition, in a narrow band, the $k_{BGS}$ is preferably 35% or less.

In view of the points described above, the reasons for the specifications of the present invention will be described, particularly with respect to the characteristics of the surface wave devices in the high frequency range of 80 MHZ to 120 MHZ.

The reason the x is specified to be about 0.95 to 0.995 is that when the x is less than about 0.95 or is more than about 0.995, this is not preferable since the Za/Zr at 120 MHZ is less than 40 dB as shown in the samples #6 and #1. The reasons for the decrease in losses mentioned above are believed to be that the sintered density of the sample #6 is decreased and a foreign phase, such as a pyrochlore phase $Pb_2Nb_2O_7$, remains in the sintered body of the sample #1. In addition, in order to obtain superior filter characteristics, as shown in the samples #2 to #4 in which the Za/Zr is 45 dB at 80 MHZ, it is particularly preferable that x be about 0.965 to 0.995.

The reason y is specified to be about 0.055 to 0.10 is that when y is less than about 0.055, this is not preferable since the average grain diameter is large even when the b/a is 2.01 or more, and the Za/Zr is less than 40 dB, as shown in the sample #7. In addition, when y is more than about 0.10 as shown in the sample #12, this is not preferable since the Za/Zr at 120 MHZ is less than 40 dB. In order to obtain superior filter characteristics, since the Za/Zr reaches 48 dB at 80 MHZ in the samples #9 and #10, it is particularly preferable that y be about 0.065 to 0.080.

The reason z is specified to be about 0.40 to 0.55 is that when the z is less than about 0.40 or is more than about 0.55, this is not preferable since the Za/Zr is less than 40 dB as shown in the samples #13 and #18. In addition, as shown in the samples #15 to #17, the Za/Zr is 45 dB or more at 80 MHZ, and hence, superior filter characteristics can be expected. Furthermore, comparing the samples #13 to #18, it is understood that a lower $k_{BGS}$ and a higher Za/Zr at high frequency ranges can be obtained in a tetragonal system than those in a rhombohedral system. As described above, in order to obtain superior filter characteristics at high frequency ranges, a tetragonal piezoelectric ceramic having z of about 0.47 to 0.55 is particularly preferable.

The reason b/a is specified to be about 2.01 to 2.40 is that when the b/a is less than about 2.01, this is not preferable since the Za/Zr is decreased to be less than 40 dB particularly at 120 MHZ due to the increase in the average grain diameter, as shown in the samples #19 and #20. In addition, when b/a is more than about 2.40, this is not preferable since the Za/Zr is less than 40 dB at 120 MHZ, and the sintering characteristics are degraded even though the average grain diameter is small, as shown in the sample #25. When b/a is specifically set to be in a range of about 2.01 to 2.24 as shown in the samples #21 to #23, #2, #3, #15, and #16, and when x, y, and z are respectively set to be in the preferable ranges described above, it is understood that significantly superior characteristics having the Za/Zr of not less than 47 dB at 80 MHZ can be obtained. When the average grain diameter is about 2.0 $\mu$m or more, as shown in the samples #19 and #20, this is not preferable since pores are formed as shown in FIG. 4B, and the Za/Zr at high frequency ranges is considerably decreased.

When not more than about 0.005 wt % $SiO_2$ is added to the major components (or when $SiO_2$ is not intentionally added and there is only an incidental $SiO_2$ impurity), the limitation of the content of $SiO_2$ as an accessory component added to the major components will be described.

As shown in the samples #3, and #26 to #28 in Tables 1 and 2, the Za/Zr is gradually decreased with the increase in the content of $SiO_2$. When the content of $SiO_2$ exceeds about 0.05 wt % as in the sample #28, this is not preferable since the Za/Zr at 120 MHZ is less than 40 db. As described above, the reason for this is believed to be that the fracture mode changes from the intergranular fracture mode to the transgranular fracture mode through the intergranular-transgranular fracture mode, and hence, a distinct gap occurs in the transgranular fracture at the surface or the edge of a substrate (see FIG. 4C) during a micro-fabrication step. This is believed to be the primary reason for the decrease in the Za/Zr at high frequency ranges.

In the piezoelectric ceramics described above, it is understood from the results obtained from the samples #29 to #31 shown in Table 2 that the same results as those described above can be obtained when at most about 5 mol % Pb is substituted with Sr, Ba or Ca. However, when more than about 5 mol % Pb is substituted with Sr, Ba or Ca, this is not preferable since the Za/Zr is less than 40 db at high frequency ranges, as shown in the samples #32 to #34.

In the examples described above, the comb electrodes each having at least one finger and being arranged to interdigitate with each other (IDT) are formed so that an electric field is applied in the direction perpendicular to the polarized direction as shown in FIG. 2. However, the present invention is not limited thereto. That is, the present invention is not limited to the relationship between the polarized direction and the direction in the electric field applied to the comb electrodes (IDT) and is not limited to a BGS wave (an SH wave). For example, even when a Rayleigh wave or the like is used as a surface wave instead of a BGS wave, or even when a bulk wave is excited on a sample in the form of a board, the same effects as described above can be obtained. This is easily understood from the sample according to the example shown in FIG. 4A in which the number of pores is very small and the surface condition thereof is superior. In addition, the Za/Zr's in the bulk waves are shown in Table 2 as references, and hence, it is understood by comparison with the comparative examples that the piezoelectric ceramics of the present invention are low loss piezoelectric ceramics having superior Za/Zr even in the bulk waves.

According to the present invention, a piezoelectric ceramic can be obtained which has an extremely small average grain diameter, significantly low loss and superior workability in micro-fabrication. In addition, when the piezoelectric ceramic of the present invention is used for a surface wave device, a surface wave device having a low loss can be obtained, and particularly, the loss at high frequency ranges can be significantly decreased. Accordingly, at high frequency ranges of not less than 100 MHZ, a filter and an oscillator having low loss and which are usable in practice can be formed.

TABLE 1

| Sample No. | x (molar ratio) | y (molar ratio) | z (molar ratio) | b/a (molar ratio) | Amount of $SiO_2$ (wt %) | Crystal System | Remarks[1] |
|---|---|---|---|---|---|---|---|
| *1 | 1.00 | 0.080 | 0.500 | 2.05 | ≦0.005 | Tetragonal Crystal | — |
| 2 | 0.995 | 0.080 | 0.500 | 2.05 | ≦0.005 | Tetragonal Crystal | — |
| 3 | 0.980 | 0.080 | 0.500 | 2.05 | ≦0.005 | Tetragonal Crystal | — |
| 4 | 0.965 | 0.080 | 0.500 | 2.05 | ≦0.005 | Tetragonal Crystal | — |
| 5 | 0.950 | 0.080 | 0.500 | 2.05 | ≦0.005 | Tetragonal Crystal | — |
| *6 | 0.930 | 0.080 | 0.500 | 2.05 | ≦0.005 | Tetragonal Crystal | — |
| *7 | 0.975 | 0.045 | 0.530 | 2.12 | ≦0.005 | Tetragonal Crystal | — |
| 8 | 0.975 | 0.055 | 0.520 | 2.12 | ≦0.005 | Tetragonal Crystal | — |
| 9 | 0.975 | 0.065 | 0.515 | 2.12 | ≦0.005 | Tetragonal Crystal | — |
| 10 | 0.975 | 0.080 | 0.505 | 2.12 | ≦0.005 | Tetragonal Crystal | — |
| 11 | 0.975 | 0.100 | 0.490 | 2.12 | ≦0.005 | Tetragonal Crystal | — |
| *12 | 0.975 | 0.120 | 0.475 | 2.12 | ≦0.005 | Tetragonal Crystal | — |
| *13 | 0.980 | 0.070 | 0.380 | 2.05 | ≦0.005 | Rhombohedral Crystal | — |
| 14 | 0.980 | 0.070 | 0.400 | 2.05 | ≦0.005 | Rhombohedral Crystal | — |
| 15 | 0.980 | 0.070 | 0.470 | 2.05 | ≦0.005 | Tetragonal Crystal | — |
| 16 | 0.980 | 0.070 | 0.510 | 2.05 | ≦0.005 | Tetragonal Crystal | — |
| 17 | 0.980 | 0.070 | 0.550 | 2.05 | ≦0.005 | Tetragonal Crystal | — |
| *18 | 0.980 | 0.070 | 0.580 | 2.05 | ≦0.005 | Tetragonal Crystal | — |
| *19 | 0.980 | 0.065 | 0.515 | 1.96 | ≦0.005 | Tetragonal Crystal | — |
| *20 | 0.980 | 0.065 | 0.515 | 2.00 | ≦0.005 | Tetragonal Crystal | — |
| 21 | 0.980 | 0.065 | 0.515 | 2.01 | ≦0.005 | Tetragonal Crystal | — |
| 22 | 0.980 | 0.065 | 0.515 | 2.12 | ≦0.005 | Tetragonal Crystal | — |
| 23 | 0.980 | 0.065 | 0.515 | 2.24 | ≦0.005 | Tetragonal Crystal | — |
| 24 | 0.980 | 0.065 | 0.515 | 2.40 | ≦0.005 | Tetragonal Crystal | — |
| *25 | 0.980 | 0.065 | 0.515 | 2.48 | ≦0.005 | Tetragonal Crystal | — |
| 26 | 0.990 | 0.080 | 0.490 | 2.12 | 0.02 | Tetragonal Crystal | — |
| 27 | 0.990 | 0.080 | 0.490 | 2.12 | 0.05 | Tetragonal Crystal | — |
| *28 | 0.990 | 0.080 | 0.490 | 2.12 | 0.08 | Tetragonal Crystal | 5 mol % Pb substituted by Sr |
| 29 | 0.990 | 0.100 | 0.490 | 2.12 | 0.01 | Tetragonal Crystal | 5 mol % Pb substituted by Ba |
| 30 | 0.990 | 0.100 | 0.490 | 2.12 | 0.01 | Tetragonal Crystal | 5 mol % Pb substituted by Ca |
| 31 | 0.990 | 0.100 | 0.490 | 2.#2 | 0.01 | Tetragonal Crystal | 10 mol % Pb substituted by Sr |
| *32 | 0.990 | 0.100 | 0.490 | 2.12 | 0.01 | Tetragonal Crystal | 10 mol % Pb substituted by Sr |
| *33 | 0.990 | 0.100 | 0.490 | 2.12 | 0.01 | Tetragonal Crystal | 10 mol % Pb substituted by Ba |
| *34 | 0.990 | 0.100 | 0.490 | 2.12 | 0.01 | Tetragonal Crystal | 10 mol % Pb substituted by Ca |

Note: Samples with asterisks are comparative examples and are out of the scope of the present invention.
[1]Shows an amount of Sr, Ba or Ca substituted for Pb; the amount in the x column includes the Sr, Ba or Ca.

TABLE 2

| Sample No. | Sintered Density (g/cm³) | Average Grain Diameter (μm) | $k_{BGS}$ (%) | Za/Zr (dB) | | | Reference[2] Bulk Wave/dB |
|---|---|---|---|---|---|---|---|
| | | | | 40 MHz | 80 MHz | 120 MHz | |
| *1 | 7.80 | 1.3 | 26 | 45 | 43 | 38 | 96 |
| 2 | 7.90 | 1.4 | 26 | 47 | 47 | 42 | 98 |
| 3 | 7.95 | 1.4 | 26 | 47 | 48 | 43 | 101 |
| 4 | 7.90 | 1.5 | 25 | 46 | 45 | 41 | 100 |
| 5 | 7.85 | 1.5 | 24 | 45 | 44 | 40 | 97 |
| *6 | 7.75 | 1.4 | 23 | 42 | 39 | 35 | 93 |
| *7 | 7.90 | 3.5 | 16 | 36 | 32 | 25 | — |
| 8 | 7.95 | 2.0 | 22 | 44 | 43 | 40 | — |
| 9 | 7.95 | 1.7 | 24 | 46 | 48 | 43 | — |
| 10 | 7.90 | 1.5 | 26 | 48 | 48 | 43 | — |
| 11 | 7.85 | 1.3 | 29 | 47 | 45 | 41 | — |
| *12 | 7.70 | 1.1 | 28 | 42 | 42 | 38 | — |
| *13 | 7.90 | 1.6 | 19 | 36 | 34 | 30 | — |
| 14 | 7.95 | 1.6 | 23 | 45 | 43 | 40 | — |
| 15 | 7.95 | 1.6 | 33 | 51 | 49 | 44 | — |
| 16 | 7.90 | 1.6 | 25 | 47 | 47 | 43 | — |
| 17 | 7.95 | 1.6 | 22 | 45 | 45 | 42 | — |
| *18 | 7.90 | 1.6 | 15 | 36 | 36 | 34 | — |

TABLE 2-continued

| Sample No. | Sintered Density (g/cm³) | Average Grain Diameter (μm) | $k_{BGS}$ (%) | Za/Zr (dB) 40 MHz | Za/Zr (dB) 80 MHz | Za/Zr (dB) 120 MHz | Reference[2] Bulk Wave/dB |
|---|---|---|---|---|---|---|---|
| *19 | 7.90 | 3.5 | 25 | 45 | 42 | 37 | 98 |
| *20 | 7.90 | 2.4 | 25 | 47 | 44 | 39 | 98 |
| 21 | 7.95 | 2.0 | 24 | 46 | 48 | 42 | 100 |
| 22 | 7.95 | 1.8 | 25 | 47 | 48 | 43 | 102 |
| 23 | 7.90 | 1.6 | 25 | 47 | 48 | 43 | 101 |
| 24 | 7.85 | 1.5 | 26 | 45 | 44 | 40 | 99 |
| *25 | 7.75 | 1.4 | 27 | 43 | 41 | 38 | 96 |
| 26 | 7.90 | 1.4 | 25 | 47 | 46 | 42 | — |
| 27 | 7.90 | 1.4 | 24 | 45 | 44 | 40 | — |
| *28 | 7.90 | 1.3 | 23 | 43 | 42 | 38 | — |
| 29 | 7.80 | 1.2 | 33 | 45 | 45 | 41 | — |
| 30 | 7.75 | 1.2 | 32 | 43 | 43 | 40 | — |
| 31 | 7.75 | 1.2 | 31 | 42 | 43 | 40 | — |
| *32 | 7.65 | 1.0 | 29 | 42 | 40 | 36 | — |
| *33 | 7.60 | 1.0 | 28 | 41 | 39 | 32 | — |
| *34 | 7.60 | 1.0 | 28 | 41 | 38 | 30 | — |

Note: Samples with asterisks are comparative examples and are out of the scope of the present invention.
[2]Shows Za/Zr of shear vibration in bulk thickness (at approximately 2 MHZ) for comparison.

What is claimed is:

1. A piezoelectric ceramic comprising:
   lead, manganese, niobium, titanium and zirconium as primary metal components;
   wherein the composition of the piezoelectric ceramic is represented by the formula $A_x\{(Mn_aNb_b)_yTi_zZr_{(1-y-z)}\}O_3$, in which, on a molar basis, $0.95 \leq x \leq 0.995$, $0.055 \leq y \leq 0.10$, $0.40 \leq z \leq 0.55$, $2.01 \leq b/a \leq 2.40$, and $a+b=1$, and in which A is Pb or the combination of Pb and one of Sr, Ba and Ca; and
   wherein the average grain diameter of the sintered piezoelectric ceramic is about 2 μm or less.

2. A piezoelectric ceramic according to claim 1, comprising not more than 0.05 wt % $SiO_2$.

3. A piezoelectric ceramic according to claim 2, wherein z is about 0.47 to 0.55, and the crystal system of the composition is a tetragonal system.

4. A piezoelectric ceramic according to claim 3, wherein the content of Sr, Ba and Ca in A is not more than 5 mol %.

5. A piezoelectric ceramic according to claim 4, wherein the piezoelectric ceramic is a constituent of a surface wave device.

6. A piezoelectric ceramic according to claim 5, wherein the surface wave device is a surface wave device using an SH wave.

7. A piezoelectric ceramic according to claim 1, wherein z is about 0.47 to 0.55, and the crystal system of the composition is a tetragonal system.

8. A piezoelectric ceramic according to claim 7, wherein the content of Sr, Ba and Ca in A is not more than 5 mol %.

9. A piezoelectric ceramic according to claim 8, wherein the piezoelectric ceramic is a constituent of a surface wave device.

10. A piezoelectric ceramic according to claim 9, wherein the surface wave device is a surface wave device using an SH wave.

11. A piezoelectric ceramic according to claim 1, wherein the content of Sr, Ba and Ca in A is not more than 5 mol %.

12. A piezoelectric ceramic according to claim 11, wherein the piezoelectric ceramic is a constituent of a surface wave device.

13. A piezoelectric ceramic according to claim 12, wherein the surface wave device is a surface wave device using an SH wave.

14. A piezoelectric ceramic according to claim 1, wherein the piezoelectric ceramic is a constituent of a surface wave device.

15. A piezoelectric ceramic according to claim 14, wherein the surface wave device is a surface wave device using an SH wave.

16. A piezoelectric ceramic according to claim 15, wherein the surface wave device is a filter.

17. A piezoelectric ceramic according to claim 15, wherein the surface wave device is an oscillator.

18. A piezoelectric ceramic according to claim 14, wherein the surface wave device is a filter.

19. A piezoelectric ceramic according to claim 14, wherein the surface wave device is an oscillator.

* * * * *